(12) United States Patent
Hähre et al.

(10) Patent No.: US 10,641,816 B2
(45) Date of Patent: May 5, 2020

(54) CURRENT CONDUCTION ELEMENT AND SYSTEM FOR INSULATION MONITORING

(71) Applicant: Dr. Ing. h.c. F. Porsche Aktiengesellschaft, Stuttgart (DE)

(72) Inventors: Karsten Hähre, Dudenhofen (DE); Raoul Heyne, Goslar (DE); Michael Kiefer, Stuttgart (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 167 days.

(21) Appl. No.: 15/895,099

(22) Filed: Feb. 13, 2018

(65) Prior Publication Data
US 2018/0231600 A1 Aug. 16, 2018

(30) Foreign Application Priority Data
Feb. 13, 2017 (DE) ................. 10 2017 102 783

(51) Int. Cl.
| | | |
|---|---|---|
| *G01R 31/12* | (2020.01) | |
| *G02B 6/44* | (2006.01) | |
| *G01D 5/353* | (2006.01) | |
| *G02B 6/26* | (2006.01) | |
| *H01B 7/02* | (2006.01) | |
| *H01B 7/32* | (2006.01) | |

(52) U.S. Cl.
CPC ......... *G01R 31/1218* (2013.01); *G01D 5/353* (2013.01); *G01D 5/35345* (2013.01); *G01D 5/35374* (2013.01); *G01R 31/1272* (2013.01); *G02B 6/262* (2013.01); *G02B 6/4421* (2013.01); *H01B 7/02* (2013.01); *H01B 7/328* (2013.01)

(58) Field of Classification Search
CPC ............ G01R 31/1218; G01R 31/1272; G01D 5/353; G02B 6/262; H01B 7/02; H01B 7/328
See application file for complete search history.

(56) References Cited

U.S. PATENT DOCUMENTS

| | | | |
|---|---|---|---|
| 6,559,437 B1 * | 5/2003 | Pope, Jr. .............. | G01M 11/086 |
| | | | 250/227.14 |
| 2011/0209894 A1 | 9/2011 | Williams et al. | |
| 2013/0335102 A1 | 12/2013 | Chirgwin et al. | |
| 2016/0018277 A1 | 1/2016 | Challener et al. | |

FOREIGN PATENT DOCUMENTS

| | | |
|---|---|---|
| CN | 201662859 U | 12/2010 |
| CN | 104205554 A | 12/2014 |
| EP | 2824794 A1 | 1/2015 |
| GB | 2164171 A | 3/1986 |

OTHER PUBLICATIONS

Chinese Office Action for Chinese Application No. 2018101339016, dated Mar. 19, 2019, 8 pages.
German Search Report for German Application No. 10 2017 102 783.1, dated Nov. 8, 2017 with partial English translation, 8 Pages.
Chinese Office Action for Chinese Application No. 2018101339016, dated Oct. 12, 2019, 6 pages.

\* cited by examiner

*Primary Examiner* — Kevin K Pyo
*Assistant Examiner* — Don J Williams
(74) *Attorney, Agent, or Firm* — RatnerPrestia

(57) ABSTRACT

A current conduction element includes an electrical conductor and an insulation of the electrical conductor. The insulation includes a light waveguiding unit. Furthermore, a system and method for insulation monitoring are described.

11 Claims, 4 Drawing Sheets

CURRENT CONDUCTION ELEMENT AND SYSTEM FOR INSULATION MONITORING

CROSS-REFERENCE TO RELATED APPLICATION

This application claims priority to German Patent Application No. DE 10 2017 102 783.1, filed Feb. 14, 2017, which is incorporated by reference herein in its entirety.

FIELD OF THE INVENTION

The present invention relates to a current conduction element comprising an electrical conductor and an insulation of the electrical conductor, and also to a system for insulation monitoring, in particular for a current conduction element.

BACKGROUND OF THE INVENTION

Defective insulations of electrical conductors are a source of danger in multiple respects. Stresses of the insulation materials, for example as a result of high electric fields or mechanical stress, can lead to insulation changes or insulation rupture. The bare conductor sections can cause a short circuit as a result of body contact. The short-circuit current can lead to damage as a result of overheating in the course of lines and cables, but also in electrical switchgear installations. Therefore, insulation monitoring is important particularly in the case of current conduction elements that carry high powers.

Insulation monitoring is a prerequisite for safe handling of current conduction elements. This becomes all the more important if the current conduction element not only is intended for handling but also carries a high power.

By way of example, charging cables for charging energy storage units of electric or hybrid vehicles have high voltages. The charging cable is situated either at the charging station or directly at the vehicle and connects the charging station to the vehicle during the charging process. Operation here is usually effected by the user of the charging station himself/herself. It is desirable to ensure that the charging cables have an intact insulation in order to preclude endangerment of the users when operating the charging cable.

SUMMARY OP THE INVENTION

Describe herein is a current conduction, element that affords increased safety.

The current conduction element comprises an electrical conductor and an insulation of the electrical conductor, wherein the insulation comprises a light waveguiding unit.

A current conduction element is thus advantageously provided which enables a detection of defects in the insulation of the electrical conductor. Defects in the insulation alter the propagation properties of light within the light waveguiding unit. In particular, even small defects, invisible to the naked eye, in the insulation already lead to changes in the light propagation within the fight waveguiding unit. Thus, even small defects in the insulation can advantageously be detected. A current conduction element having defective insulation can thus easily be identified and decommissioned. The current conduction element according to aspects of the invention enables comparatively safe electrical conduction systems.

Within the meaning of the present invention, the current conduction element is embodied for example as an elastic, rigid or flexurally stack current conduction element.

Within the meaning of the present invention, the electrical conductor is embodied as a single electrical conductor or as a conductor bundle of two or more electrical conductors. The electrical conductor can comprise for example a multiple-stranded wire or a multiple-stranded wire bundle. The electrical conductor can comprise supply lines and/or signal lines and/or further lines.

Within the meaning of the present invention, the insulation comprises at least one light waveguiding unit. The insulation can also comprise two or more light waveguiding units.

In one preferred embodiment of the present invention, the light waveguiding unit coaxially surrounds the electrical conductor at least along a longitudinal section of the electrical conductor.

The light waveguiding unit can completely coaxially surround the electrical conductor over the complete length thereof. The insulation of the electrical conductor can thus be monitored over the entire length thereof. Alternatively, the light waveguiding unit can coaxially surround the electrical conductor only along a longitudinal section of the electrical conductor. As a result, a detection of defects of the insulation of the electrical conductor is restricted to this region. It is thus advantageously possible, particularly in the case of long conduction systems with sections having varying loading and exposure, to restrict the monitorable region to the relevant sections of the electrical conductor.

It is also conceivable for the light waveguiding unit to coaxially surround the electrical conductor in a plurality of sections separated from one another, or for different sections of the electrical conductor to be coaxially surrounded by different light waveguiding units.

The use of different light waveguiding units in different sections of the electrical conductor advantageously facilitates the localization of the defect of the insulation.

In a further preferred embodiment of the present invention, the insulation of the electrical conductor comprises an insulant sheath.

The insulant sheath preferably coaxially surrounds the electrical conductor. The insulant sheath comprises an insulant. Any nonconductive material is suitable as insulant, for example from one of the classes of insulant according to DIN EN 60085. Insulants are for example technical ceramics, plastics (for example thermoplastics and/or thermosetting plastics), elastomers, electrically insulating paper, polymers, glass and mica. In this case, the insulant sheath can also comprise different insulants. In one preferred embodiment, the electrical conductor comprises a plastic sheath.

In this case, light waveguiding unit and insulant sheath can be arranged such that the light waveguiding unit and the insulant sheath form coaxially arranged layers around the electrical conductor. In one preferred embodiment, the light waveguiding unit is arranged between electrical conductor and insulant sheath.

In an alternative embodiment, the light waveguiding unit is incorporated into the insulant sheath, that is to say that the insulant sheath surrounds the light waveguiding unit. It is thus possible to detect breaches of the insulation that comprise a breach of an outer layer of the insulant sheath and a breach of the light waveguiding unit. The breach of the insulation can thus advantageously be detected if an inner layer of the insulant sheath is still intact.

In a further preferred embodiment of the present invention, the light waveguiding unit comprises at least one optical waveguide.

An optical waveguide within the meaning of the present invention comprises cables and lines for transmitting light. Preferably, the optical waveguide comprises a light guide or a light guide bundle. Furthermore, the optical waveguide can be fabricated in part with plug connectors.

Preferably, the light waveguiding unit comprises one optical waveguide. In an alternative embodiment, the light waveguiding unit comprises two or more optical waveguides.

In a further preferred embodiment of the present invention, the at least one optical waveguide comprises a reflective end.

Light coupled into a first end of the optical waveguide is reflected at the second, reflective end and guided back again to the first end. By way of example, the at least one optical waveguide can comprise a written interference filter, for example a fiber Bragg grating, at one end. The interference filter reflects light having a wavelength within a predefined filter bandwidth.

In a further preferred embodiment of the present invention, the electrical conductor comprises a first winding with the at least one optical waveguide at least along a longitudinal section of the electrical conductor.

The winding provides the insulation with an optical waveguide lattice. In this case, the density of the winding determines the minimum size of the detectable defects. Defects having a smaller diameter are not detectable by the winding.

In one preferred embodiment, the winding comprises a helix. The optical waveguide is wound around the electrical conductor in a helix along the longitudinal axis of the electrical conductor. In this case, the winding is preferably dense, that is to say that adjacent sections of the optical waveguide touch one another.

In a further preferred embodiment of the present invention, the electrical conductor comprises a second winding with an optical waveguide, said second winding being crossed by the first winding, at least along a longitudinal section of the electrical conductor.

The electrical conductor comprises a winding with an optical waveguide net, wherein the net comprises a first winding and a second winding crossed by the first winding. This advantageously gives rise to a close grid for detecting defects of the insulation of the electrical conductor.

In one preferred embodiment, the electrical conductor comprises a winding consisting of a first outgoing winding in the form of a helix and a return winding, crossed by the outgoing winding. In this case, the return winding can be implemented with the same optical waveguide as the outgoing winding. The optical waveguide preferably comprises a loop between outgoing and return windings.

In an alternative embodiment, the outgoing winding comprises a first optical waveguide and the return winding comprises a second optical waveguide, wherein both optical waveguides each comprise a reflective end, such that both evaluation units can be arranged at the same section of the electrical conductor.

In an alternative preferred embodiment of the present invention, the light waveguiding unit comprises at least one optically conductive film.

The optically conductive film is preferably flexible and mechanically robust. The optically conductive film preferably comprises a film, for example a plastic film or polymer film, to which optically conductive structures are applied. Alternatively, the optically conductive structures can be introduced into the film. The optically conductive film can comprise a coating.

In a further preferred embodiment of the present invention, the at least one optically conductive film comprises a plurality of optical waveguides.

The optical waveguides are applied to the optically conductive film in a geometry. The optical waveguides of the optical film preferably form a close grid for detecting defects of the insulation of the electrical conductor. By means of the optically conductive film, it is possible to provide the electrical conductor easily and rapidly with a grid for detecting defects in the insulation.

In a further preferred embodiment of the present invention, the at least one optically conductive film is connected to at least one optical waveguide.

Preferably, the optical waveguide focuses the light emerging from the optically conductive film at at least one end of the optically conductive film. It is thus advantageously possible for the light emerging at the end of the film to be guided back to the entrance point of the light. In this case, the entrance point is the section of the electrical conductor at which the light is coupled into the optical film. However, it is also conceivable for the emerging light to be guided to any other location, for example to an evaluation unit.

It is conceivable for the optically conductive film to comprise a further optical waveguide at an opposite end relative to the at least one end. Preferably, the further optical waveguide guides the light entering the optically conductive film.

The optical waveguide connected to the optically conductive film can also connect a plurality of optically conductive films to one another. The electrical conductor can comprise optically conductive films for detecting a possible breach of the insulation for example in sections of elevated loading, wherein the individual optically conductive films are connected to one another by means of optical waveguides. In this case, the optically conductive film that is the furthest away from the light input coupling location preferably comprises an optical waveguide for guiding back the emerging light.

In a further preferred embodiment of the present invention, the optical waveguides of the at least one optically conductive film are arranged parallel to one another.

Preferably, the optical waveguides of the optically conductive film form a lattice arranged coaxially with respect to the cylinder axis of the electrical conductor. In this case, the distance between the individual optical waveguides is preferably maximally of the same magnitude as the maximum diameter of a breach that can be closed by elastic deformation of the insulation.

Preferably, the optically conductive film comprises an optical waveguide that focuses the light emerging from the other optical waveguides of the optically conductive film at one end of the film and guides it back to the other end of the film. In this case, the ends of the optically conductive film are the side edges of the film which are perpendicular to the parallel optical waveguides.

In an alternative preferred embodiment of the present invention, the optical waveguides of the at least one optically conductive film are arranged in a lattice, wherein light is reflectable within the at least one optically conductive film.

As a result, it is advantageously possible to dispense with an optical waveguide for guiding back the emerging light, for example to the entrance point of the light. The light enters the film, is reflected and emerges at the entrance end of the film. Alternatively, it is also possible to couple light from a further light source into the film.

In a further preferred embodiment of the present invention, the at least one optically conductive film comprises at least one evaluation unit and/or at least one measuring unit and/or at least one light source.

Within the meaning of the present invention, the evaluation unit is suitable for evaluating at least one property of the light emerging from the optically conductive film, before, after or during the emergence from the film. In this case, the evaluation unit can compare the at least one property with a reference variable. By way of example, the evaluation unit can check whether the at least one property exceeds a setpoint value. Alternatively or additionally, the evaluation unit can check whether the at least one property falls below a setpoint value. The evaluation unit can thus also check whether the at least one property lies in a setpoint interval.

The light source is suitable making available light or transport within the optically conductive film.

A further subject matter of the present invention is a system for insulation monitoring, comprising at least one current conduction element comprising a light source, comprising an input coupling unit for coupling the light from the light source into the light waveguiding unit of the at least one current conduction element, furthermore comprising a measuring unit for measuring at least one emergence property of the light transported by the light waveguiding unit, furthermore comprising an evaluation unit for evaluating the at least one measured emergence property of the light transported by the light waveguiding unit.

In one preferred embodiment of the present invention, the light source comprises a diode, for example a super luminescence diode. In one preferred embodiment, the light source can be fitted behind the input coupling unit. Alternatively, however, light source and input coupling unit can also be embodied as one unit.

Any property which enables a detection of changes in the light propagation within the light waveguiding unit is suitable as emergence property. Preferably, the emergence property is measurable reliably and simply with sufficiently, high measurement accuracy. An emergence property is for example the intensity of the light emerging from the light waveguiding unit. Therefore, the emergence property is the property which the light has directly before, during or directly after emergence from the light waveguiding unit. The measuring unit is suitable for example for measuring the intensity of the light emerging from the light waveguiding unit. The measuring unit preferably comprises a photodiode.

In one preferred embodiment, the evaluation unit can be connected downstream of the measuring unit. Alternatively, however, measuring unit and evaluation unit can also be embodied as one unit.

Preferably, evaluation unit, measuring unit, input coupling unit and light source are arranged at the same section of the electrical conductor.

A further subject matter of the present invention is a method for insulation monitoring of a current conduction element by means of a system wherein, in a first step, light from the light source is coupled into the light waveguiding unit, wherein, in a second step, at least one emergence property of the light upon emergence from the light waveguiding unit is measured by means of the measuring device for measuring the light transported by the light waveguiding unit, and wherein, in a third step, at least one emergence property is evaluated by means of the evaluation unit, wherein a defect of the insulation of the current conduction element is detected by means of a deviation of the at least one emergence property from a reference value.

Within the meaning of the present invention, ascertaining the deviation of the at least one, measured emergence property with a reference value includes both checking whether the emergence property exceeds a setpoint value and, alternatively or additionally, checking whether the emergence property falls below a setpoint value.

BRIEF DESCRIPTION OF THE DRAWINGS

Further details, features and advantages of the invention are evident from the drawings, and also from the following description of preferred embodiments with reference to the drawings. In this case, the drawings merely illustrate exemplary embodiments of the invention which do not restrict the essential concept of the invention.

DETAILED DESCRIPTION OF THE INVENTION

In the different figures, identical parts are always provided with the same reference signs and therefore generally are also cited or mentioned only once in each case.

Figure 1:
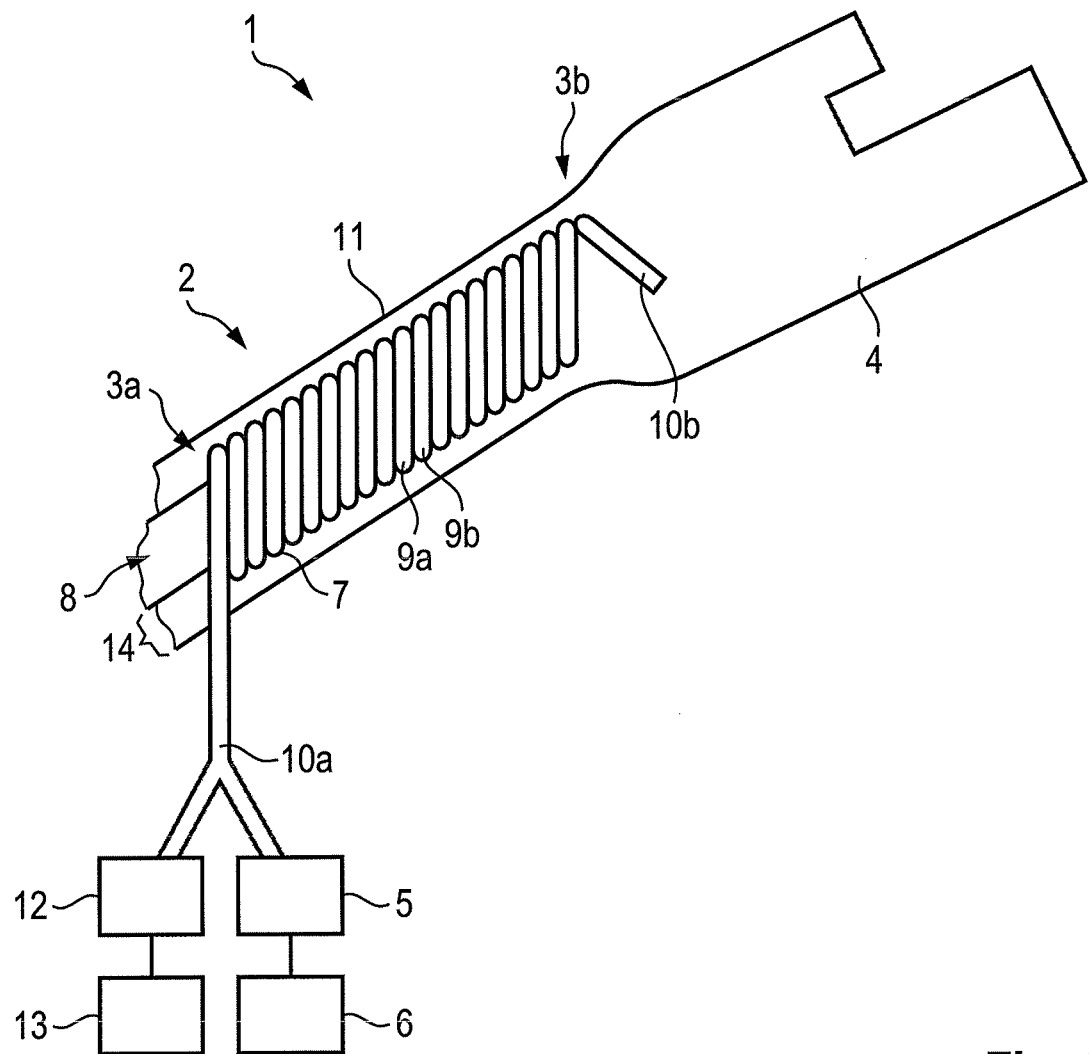
FIG. 1 schematically illustrates a system for insulation monitoring in accordance with one preferred embodiment of the present invention.

FIG. 1 illustrates a system for insulation monitoring 1 in accordance with one preferred embodiment of the present invention. The system for insulation monitoring 1 comprises a current conduction element 2. The current conduction element 2 is for example a charging cable for charging an energy storage unit of an electric or hybrid vehicle. The current conduction element 2 comprises a first end 3a and a second end 3b. At the second end 3b, the current conduction element 2 comprises a plug 4, for example a CCS plug. At the first end 3a, the current conduction element 2 comprises an input coupling unit 5 and a light source 6 for example in the form of a super luminescence diode, said light source being connected to the input coupling unit 5. Alternatively, the input coupling unit can be arranged at any arbitrary section of the current conduction element 2 which appears to be suitable for this purpose, for example is arranged directly in the charging station, etc.

The input coupling unit 5 is connected to a first end of an optical waveguide 7. The light emitted by the light source 6 is coupled into the optical waveguide 7 by means of the input coupling unit 5. The current conduction element 2 furthermore comprises an electrical conductor 8. By way of example, the electrical conductor comprises supply and signal lines.

The optical waveguide 7 is wound helically around the electrical conductor 8 and thus provides the electrical conductor 8 with a closely wound helix. The winding is implemented in one direction, from the first end 3a to the second end 3b of the current conduction element 2. The winding encloses the optical waveguide 7 preferably densely, i.e. in such a way that adjacent subsections 9a, 9b of the optical waveguide 7 touch one another. The winding is surrounded coaxially with an insulant sheath 11.

As a result of the close winding, the electrical conductor 8 is advantageously provided with a close grid for detecting breaches of the insulation of the electrical conductor 8. In this case, a first end 10a of the optical waveguide is connected to the input coupling unit 5. The first end 10a is preferably connected to a measuring unit 12. The measuring unit 12 can be embodied for example as a photodiode. An evaluation unit 13 is connected downstream of the measuring unit 12.

A second end 10b of the optical waveguide ends the plug 4 of the current conduction element 2. The second end 10b is embodied in a reflective fashion. By way of example, the second end 10b comprises a fiber Bragg grating.

The light source 6 emits light that is coupled into the optical waveguide 7 by means of the input coupling unit 5. The light propagates along the optical waveguide 7, is reflected at the second end 10b thereof and emerges from the optical waveguide 7 at the first end 10a of said optical waveguide and enters the measuring unit 12. The measuring unit 12, for example a photodiode, is suitable for measuring at least one property of the light emerging from the optical waveguide 7. By way of example, the intensity of the emerging light can be measured. The evaluation unit 13 connected to the measuring unit 12 preferably compares the measurement value with a predefined reference interval. Alternatively, the evaluation unit 13 can compare the measurement value with a predefined threshold value. If the insulation 14 of the current conduction element 2, comprising the optical waveguide 7 and an insulant sheath 11, has a breach, the light propagation in the optical waveguide 7 is disturbed. By way of example, incisions or cracks in the optical waveguide 7 lead to deviations in the reflection behavior of the light transported in the optical waveguide 7. The light is scattered at the breach of the insulation, for example the incision or the crack. The intensity of the light emerging at the first end 10a is reduced as a result of such an incision or crack in the insulation 14 of the current conduction element 2. The measurement value, namely the measured intensity, falls below a threshold value. This is detected by the evaluation unit 13. The evaluation unit 13 is suitable for indicating the detection of a defect in the insulation 14 of the current conduction element 2 by means of a signal.

Input coupling unit 5, light source 6, measuring unit 12 and evaluation unit 13 are preferably arranged in a housing. The housing can be arranged at a suitable section of the current conduction element 2. By way of example, the housing can be arranged at a first end 3a of the current conduction element 2. However, it is also conceivable for the housing with input coupling unit 5, light source 6, measuring unit 12 and evaluation unit 13 to be fitted at the second end 3b of the current conduction element 2 in the plug 4. Correspondingly, the first end 10a of the optical waveguide 7 is then embodied in a reflective fashion and input coupling unit 5 and measuring unit 12 are connected to the second end 10b of the optical waveguide 7.

Figure 2:
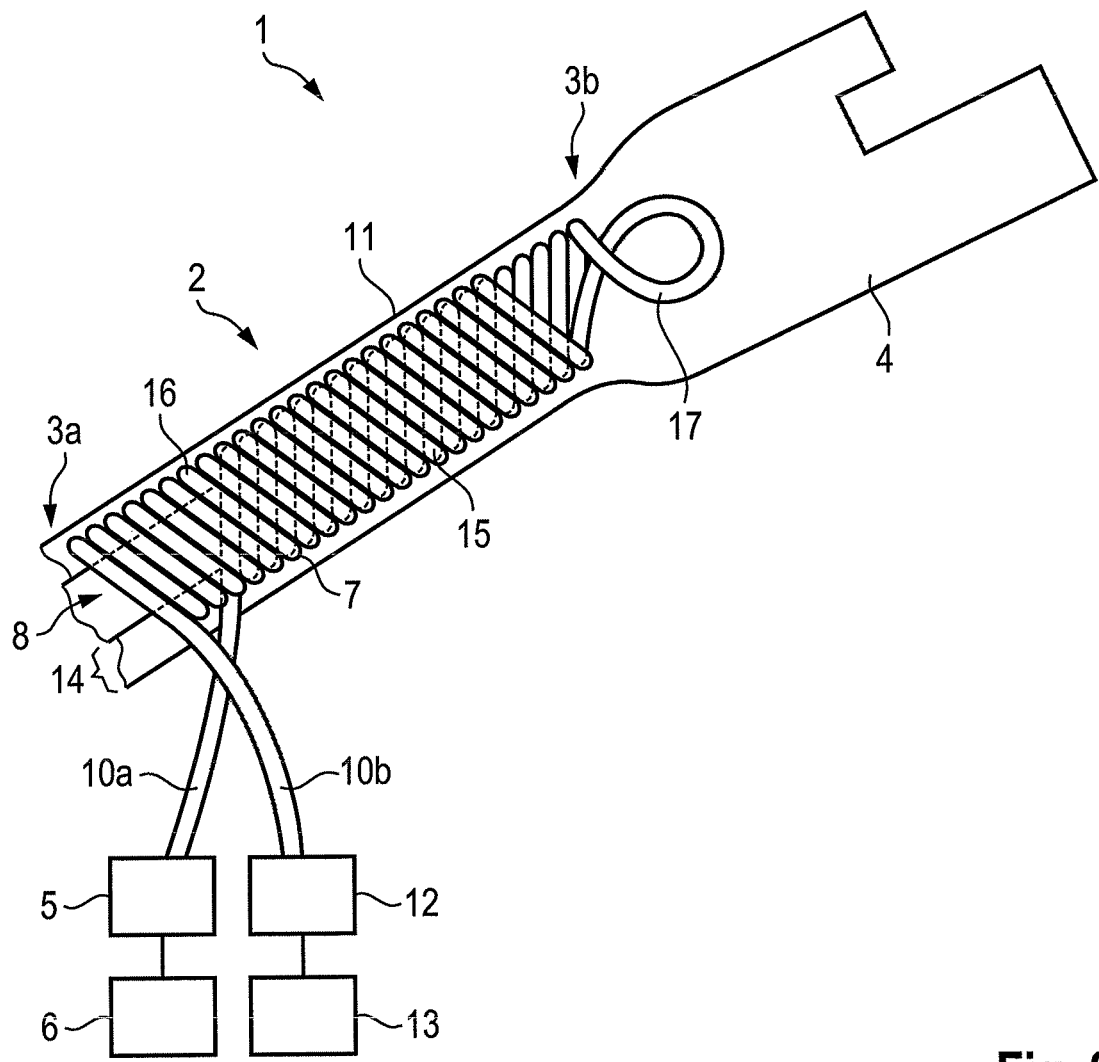
FIG. 2 schematically illustrates a system for insulation monitoring in accordance with an alternative preferred embodiment of the present invention.

FIG. 2 schematically illustrates a system for insulation monitoring 1 in accordance with an alternative preferred embodiment of the present invention. As in FIG. 1, the system for insulation monitoring 1 comprises a current conduction element 2. The current conduction element 2 is for example a charging cable for charging an energy storage unit of an electric or hybrid vehicle. The current conduction element 2 comprises a first end 3a and a second end 3b. At the second end 3b, the current conduction element 2 comprises a plug 4, for example a CCS plug. At the first end 3a, the current conduction element 2 comprises an input coupling unit 5 and a light source 6 for example in the form of a super luminescence diode, said light source being connected to the input coupling unit 5. Alternatively, the input coupling unit can be arranged at any arbitrary section of the current conduction element 2 which appears to be suitable for this purpose, for example is arranged in the charging station, etc.

The input coupling unit 5 is connected to a first end of an optical waveguide 7. The light emitted by the light source 6 is coupled into the optical waveguide 7 by means of the input coupling unit 5. The current conduction element 2 furthermore comprises an electrical conductor 8. By way of example, the electrical conductor comprises supply and signal lines.

The optical waveguide 7 is wound helically around the electrical conductor 8. In this case, the winding with the optical waveguide 7 comprises a first helical winding from the first end 3a to the second end 3b and a second helical winding from the second end 3b to the first end 3a, said second winding being crossed by the first winding. In this case, outgoing winding 15 and return winding 16 preferably form a close lattice around the electrical conductor 7. At the transition from the outgoing winding 15 to the return winding 16, the optical waveguide 7 comprises a loop 17. The loop 17 enables the transition from the winding angle of the outgoing winding 15 to the winding angle of the return winding 16. The electrical conductor 8 thus comprises a closely wound lattice composed of two crossed helices.

The return winding 16 advantageously leads the optical waveguide 7 back again to the first end 3a of the current conduction element 2. That is to say that the two ends 10a, 10b are arranged at one end 3a of the current conduction element 2. As a result, the embodiment of one end 10 of the optical waveguide 7 as a reflective end, for example by writing a fiber Bragg grating, is advantageously obviated. The measuring unit 12 is connected to the second end 10b of the optical waveguide 7. An evaluation unit 13 is connected downstream of the measuring unit 12.

The light source 6 emits light that is coupled into the optical waveguide 7 at the first end 10a by means of the input coupling unit 5. The light propagates along the optical waveguide 7 and emerges from the optical waveguide 7 at the second end 10b of said optical waveguide and enters the measuring unit 12. In this case, the light covers the path between first end 3a and second end 3b of the current conduction element 2 twice. The measuring unit 12, for example a photodiode, is suitable for measuring at least one property of the light emerging from the optical waveguide 7. By way of example, the intensity of the emerging light can be measured. The evaluation unit 13 connected to the measuring unit 12 preferably compares the measurement value with a predefined reference interval. Alternatively, the evaluation unit 13 can compare the measurement value with a predefined threshold value. If the insulation 14 of the current conduction element 2, comprising the optical waveguide 7 and an insulant sheath 11, has a breach, the light propagation in the optical waveguide 7 is disturbed. By way of example, incisions or cracks in the optical waveguide 7 lead to deviations in the reflection behavior of the light transported in the optical waveguide 7. The light is scattered at the breach of the insulation, for example the incision or the crack. The intensity of the light emerging at the second end 10b is reduced as a result of such an incision or crack in the insulation 14 of the current conduction element 2. The measurement value, namely the measured intensity, falls below a threshold value. This is detected by the evaluation unit 13. The evaluation unit 13 is suitable for indicating the detection of a defect in the insulation 14 of the current conduction element 2 by means of a signal.

The two ends 10a, 10b of the optical waveguide 7 can be arranged closely alongside one another in the same section of the current conduction element 2. In this case, it is advantageously possible to arrange input coupling unit 5, light source 6, measuring unit 12 and evaluation unit 13 in a housing.

Figure 3:
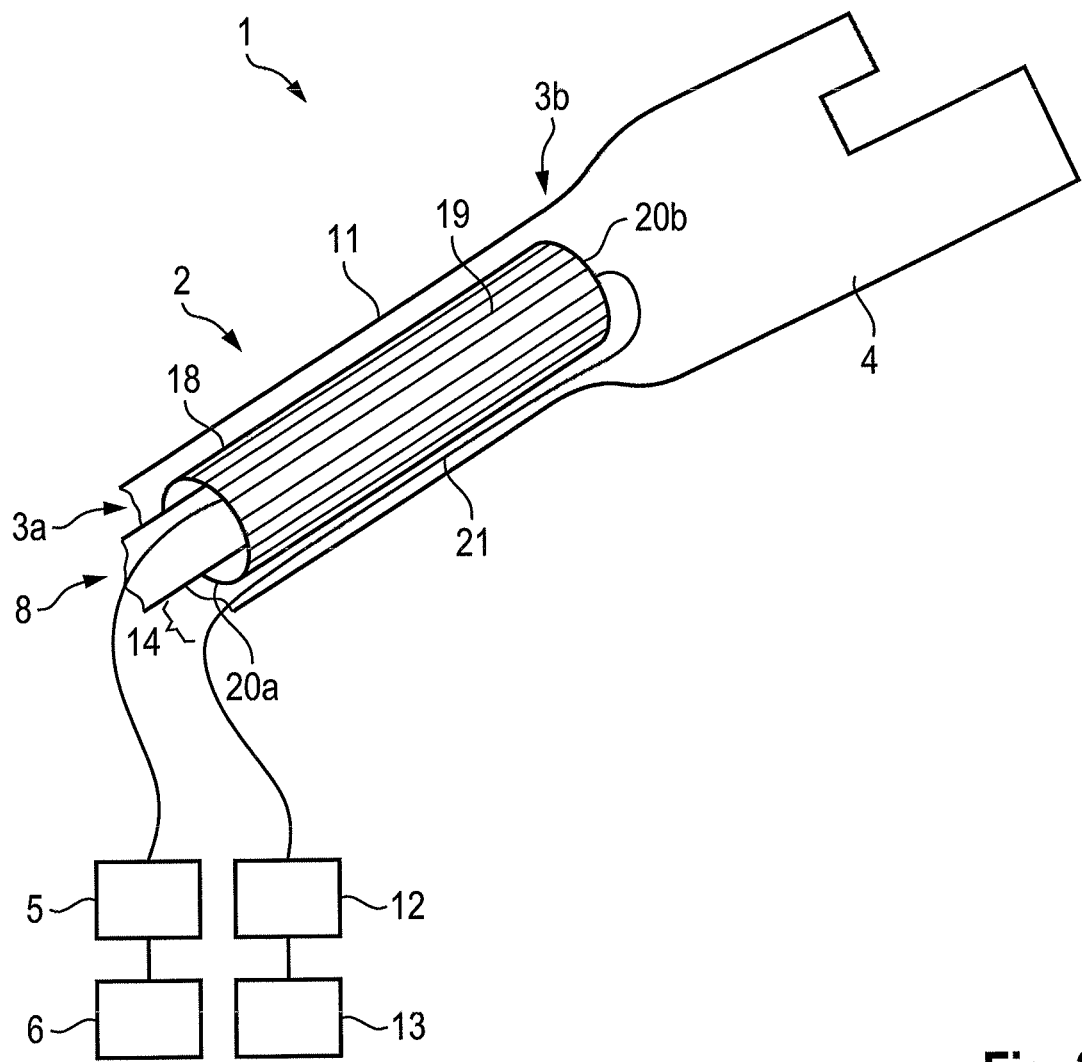
FIG. 3 schematically illustrates a system for insulation monitoring in accordance with an alternative preferred embodiment of the present invention.

FIG. 3 schematically illustrates a system for insulation monitoring 1 in accordance with an alternative preferred embodiment of the present invention. The system for insulation monitoring 1 comprises a current conduction element 2. The current conduction element 2 is for example a charging cable for charging an energy storage unit of an electric or hybrid vehicle. The current conduction element 2 comprises a first end 3a and a second end 3b. At the second end 3b, the current conduction element 2 comprises a plug 4, for example a CCS plug. At the first end 3a, the current conduction element 2 comprises an input coupling unit 5 and a light source 6 for example in the form of a super luminescence diode, said light source being connected to the input coupling unit 5. Alternatively, the input coupling unit can be arranged at any arbitrary section of the current conduction element 2 which appears to be suitable for this purpose, for example is arranged in the charging station, etc.

The input coupling unit 5 is connected to a first end 20a of an optically conductive film 18. Preferably, the optically conductive film is embodied in a flexible fashion and comprises a plurality of optical waveguides 19.

The light emitted by the light source 6 is coupled into the optically conductive film 18 at the first end 20a by means of the input coupling unit 5. The current conduction element 2 furthermore comprises an electrical conductor 8. By way of example, the electrical conductor comprises supply and signal lines.

The optically conductive film 18 is arranged coaxially around the electrical conductor 8. The optically conductive film 18 forms a cylinder which is arranged directly on the electrical conductor and surrounds the latter. The optically conductive film 18 preferably comprises optical waveguides 19. In one preferred embodiment, the optical waveguides 19 are arranged parallel to one another on the film 18. Preferably, the distance between the optical waveguides 19 is 0.5 mm or less. As a result, it is possible to detect cracks and breaches in the insulation 14 which are larger than 0.5 mm. Breaches and cracks which are smaller than 0.5 mm can be closed by elastic deformations of the insulation material.

At a second end 20b, the optically conductive film 18 comprises an optical waveguide 21. The optical waveguide 21 focuses the light emerging from the optically conductive film 18. In one preferred embodiment, the second end 20b of the optically conductive film 18 is situated at the second end 3b of the current conduction element 2. The optical waveguide 21 leads from the second end 3b to the first end 3a of the current conduction element 2. The measuring unit 12 is connected to the optical waveguide 21. An evaluation unit 13 is connected downstream of the measuring unit 12.

The light source 6 emits light that is coupled into the optically conductive film at the first end 20a by means of the input coupling unit 5. The light propagates along the optical waveguides 19 in the optically conductive film 18 and emerges from the optically conductive film 18 at the second end 20b of said optically conductive film. The light is focused at the second end 20b in an optical waveguide 21 and guided back to the first end 3a. Here, the light emerges from the optical waveguide 21 and enters the measuring unit 12. In this case, the light covers the path between first end 3a and second end 3b of the current conduction element 2 twice. The measuring unit 12, for example a photodiode, is suitable for measuring at least one property of the light emerging from the optical waveguide 21. By way of example, the intensity of the emerging light can be measured. The evaluation unit 13 connected to the measuring unit 12 preferably compares the measurement value with a predefined reference interval. Alternatively, the evaluation unit 13 can compare the measurement value with a predefined threshold value. If the insulation 14 of the current conduction element 2, comprising the optically conductive film 18 and an insulant sheath 11, has a breach, the light propagation in the optical waveguide 19 is disturbed. By way of example, incisions or cracks in the optically conductive film 18 lead to deviations in the reflection behavior of the light transported in the optically conductive film 18. The light is scattered at the breach of the insulation, for example the incision or the crack. The intensity of the light emerging at the second end 20b is reduced as a result of such an incision or crack in the insulation 14 of the current conduction element 2. The measurement value, namely the measured intensity, falls below a threshold value. This is detected by the evaluation unit 13. The evaluation unit 13 is suitable for indicating the detection of a defect in the insulation 14 of the current conduction element 2 by means of a signal.

Figure 4:
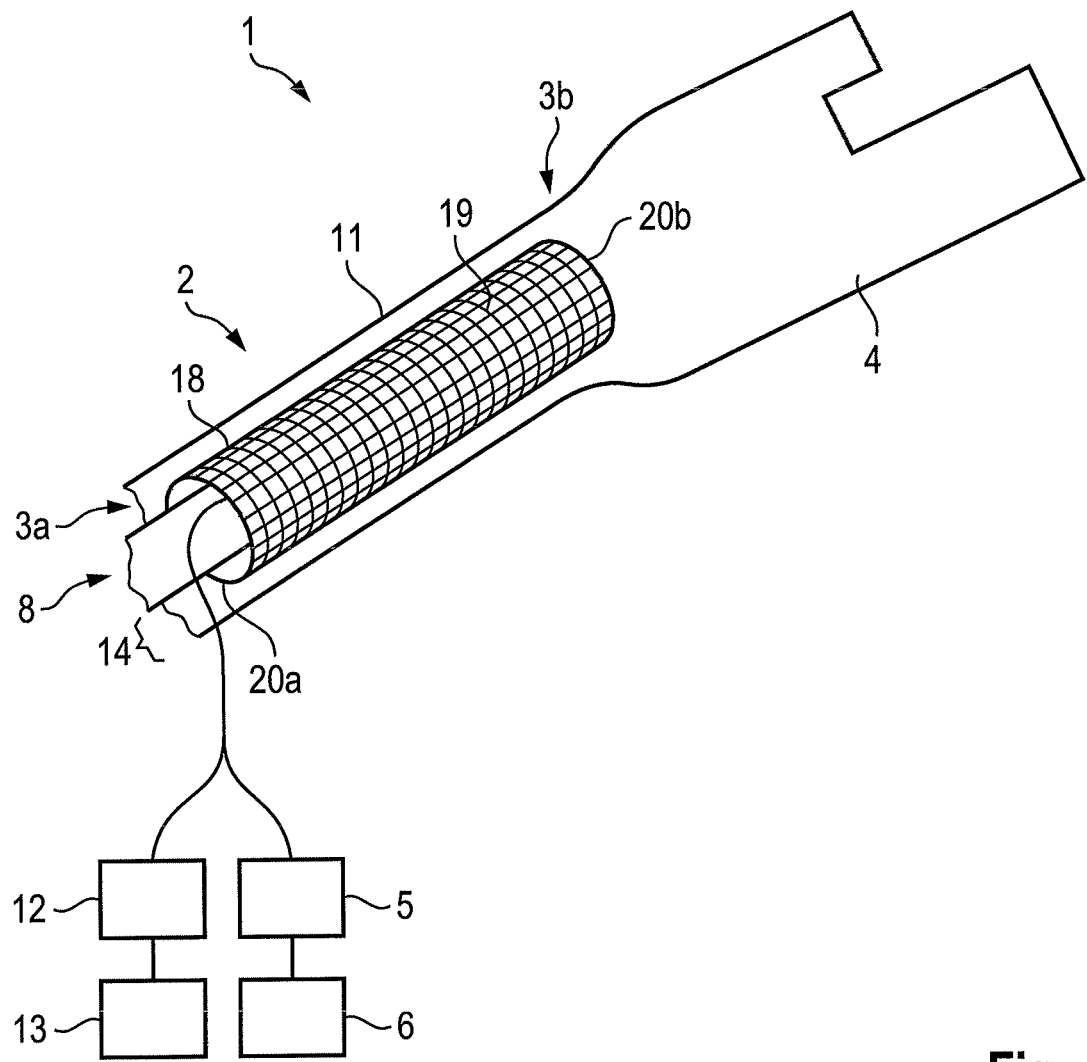
FIG. 4 schematically illustrates a system for insulation monitoring in accordance with an alternative preferred embodiment of the present invention.

In an alternative embodiment, the optical waveguides 19 can be arranged in a lattice on the optically conductive film 18, see FIG. 4. The light is then reflected within the optical film 18. It is then not necessary for the light to be focused and guided back from the second end 20b of the optically conductive film 18 to the first end of the optically conductive film 18. The light is coupled into the film 18 at the first end 20a and also emerges from the film 18 at the first end 20a. In this preferred embodiment, the measuring unit 12 is connected to the first end 20a of the optically conductive film 18. The evaluation unit 13 is connected downstream of the measuring unit 12, for example. In this case, the density and size of the lattice meshes determines the size of the defects of the insulation 14 that is minimally detectable.

Input coupling unit 5, light source 6, measuring unit 12 and evaluation unit 13 can be arranged in a housing. In an alternative embodiment, the input coupling unit 5, the light source 6, the measuring unit 12 and the evaluation unit 13 are integrated into the optical film 18. It is thereby advantageously possible for only the evaluated signal to be led out of the optical film 18. In a further alternative embodiment, only at least one of the components input coupling unit 5, light source 6, measuring unit 12 and evaluation unit 13 is integrated into the optical film 18, while the other components remain outside the optical film.

What is claimed is:

1. A current conduction element comprising:
   an electrical conductor; and
   an insulation of the electrical conductor, the insulation including an insulant sheath and a light waveguiding unit, wherein:
   the light waveguiding unit includes at least one optically conductive film coaxially surrounding the electrical conductor at least along a longitudinal section of the electrical conductor;
   the at least one optically conductive film is formed of a plurality of waveguides and forms a cylinder which is underneath the insulant sheath and arranged directly on and in contact with the electrical conductor to surround the electrical conductor;

a distance between each of the plurality of optical waveguides corresponds to a minimal detectable crack size of the insulant sheath; and the distance between the plurality of optical waveguides corresponds to a maximum diameter of a breach configured to be closed by elastic deformation of the insulant sheath.

2. The current conduction element as claimed in claim 1, wherein the plurality of optical waveguides each include a reflective end.

3. The current conduction element as claimed in claim 1, wherein the electrical conductor comprises a first winding with the plurality of optical waveguides at least along the longitudinal section of the electrical conductor.

4. The current conduction element as claimed in claim 3, wherein the electrical conductor comprises a second winding with the plurality of optical waveguides, said second winding being crossed by the first winding, at least along the longitudinal section of the electrical conductor.

5. The current conduction element as claimed in claim 1, wherein the plurality of optical waveguides of the at least one optically conductive film are arranged parallel to one another.

6. The current conduction element as claimed in claim 1, wherein the plurality of optical waveguides of the at least one optically conductive film are arranged in a lattice, wherein light is reflectable within the at least one optically conductive film.

7. The current conduction element as claimed in claim 1, wherein the at least one optically conductive film comprises at least one evaluation unit or at least one measuring unit or at least one light source.

8. A system for insulation monitoring, comprising:
at least one current conduction element as claimed in claim 1,
a light source,
an input coupling unit for coupling light from the light source into the light waveguiding unit of the at least one current conduction element,
a measuring unit for measuring at least one emergence property of the light transported by the light waveguiding unit, and
an evaluation unit for evaluating the at least one measured emergence property of the light transported by the light waveguiding unit, wherein a defect of the insulation of the current conduction element is detected by a deviation of the at least one emergence property from a reference light intensity value.

9. The current conduction element as claimed in claim 1, wherein the at least one optically conductive film is a coating on the electrical conductor.

10. A method for insulation monitoring of a current conduction element including an electrical conductor and an insulation of the electrical conductor, the method comprising:
coupling light from a light source into a light waveguiding unit of the insulation, the insulation further including an insulant sheath, wherein:
the light waveguiding unit includes at least one optically conductive film coaxially surrounding the electrical conductor at least along a longitudinal section of the electrical conductor;
the at least one optically conductive film is formed of a plurality of waveguides and forms a cylinder which is underneath the insulant sheath and arranged directly on and in contact with the electrical conductor to surround the electrical conductor;
a distance between each of the plurality of optical waveguides corresponds to a minimal detectable crack size of the insulant sheath;
the distance between the plurality of optical waveguides corresponds to a maximum diameter of a breach configured to be closed by elastic deformation of the insulant sheath; and
a defect of the insulation of the current conduction element is detected by a deviation of the at least one emergence property from a reference light intensity value,
measuring at least one emergence property of the light upon emergence from the light waveguiding unit using a measuring device for measuring the light transported by the light waveguiding unit, and
evaulating the at least one emergence property using the evaluation unit, wherein a defect of the insulation of the current conduction element is detected by a deviation of the at least one emergence property from a reference value.

11. The method as claimed in claim 10, further comprising:
depositing the at least one optically conductive film as a coating on the electrical conductor.

* * * * *